(12) United States Patent
Maruhashi et al.

(10) Patent No.: US 8,326,244 B2
(45) Date of Patent: Dec. 4, 2012

(54) POWER AMPLIFIER, AND METHOD OF CONTROLLING POWER AMPLIFIER

(75) Inventors: Kenichi Maruhashi, Tokyo (JP); Masahiro Tanomura, Tokyo (JP); Hidenori Shimawaki, Tokyo (JP)

(73) Assignee: NEC Corporation, Tokyo (JP)

( * ) Notice: Subject to any disclaimer, the term of this patent is extended or adjusted under 35 U.S.C. 154(b) by 145 days.

(21) Appl. No.: 12/682,175

(22) PCT Filed: Sep. 5, 2008

(86) PCT No.: PCT/JP2008/066095
§ 371 (c)(1),
(2), (4) Date: Apr. 8, 2010

(87) PCT Pub. No.: WO2009/057385
PCT Pub. Date: May 7, 2009

(65) Prior Publication Data
US 2010/0225399 A1    Sep. 9, 2010

(30) Foreign Application Priority Data

Oct. 31, 2007   (JP) .................................. 2007-283539
May 20, 2008   (JP) .................................. 2008-131772

(51) Int. Cl.
*H01Q 11/12*   (2006.01)
*H04K 3/00*    (2006.01)
(52) U.S. Cl. .................................... 455/127.1; 330/127
(58) Field of Classification Search .... 455/127.1–127.2, 455/127.4; 330/127, 129–131, 135–136, 330/285
See application file for complete search history.

(56) References Cited

U.S. PATENT DOCUMENTS

2005/0200407 A1*   9/2005   Arai et al. ..................... 330/133

FOREIGN PATENT DOCUMENTS

| JP | 02-168721    | 6/1990  |
|----|--------------|---------|
| JP | 09-330344    | 12/1997 |
| JP | 2000-174559  | 6/2000  |
| JP | 2000-323709  | 11/2000 |
| JP | 2001-156554  | 6/2001  |
| JP | 2001-257544  | 9/2001  |
| JP | 2001-284457  | 10/2001 |
| JP | 2003-298364  | 10/2003 |
| JP | 2004-235797  | 8/2004  |

(Continued)

OTHER PUBLICATIONS

International Publication No. WO 03/073603 A2, dated Sep. 4, 2003 (Abstract only).

(Continued)

*Primary Examiner* — Lee Nguyen
(74) *Attorney, Agent, or Firm* — Scully, Scott, Murphy & Presser PC

(57) ABSTRACT

A power amplifier of the present invention comprises MOS transistor (1) having a gate length of 180 nm or less, and output matching circuit (5) connected to a drain terminal of MOS transistor (1). Also, MOS transistor (1) is applied with voltage $Vd\_n$ normalized by a voltage value allowable in a DC state as a drain-source voltage, where $Vd\_n$ is in a range of 0.5 to 0.9. $ZL$ ($=RH+j\cdot XL$) represents a value equal to a load impedance when viewing the output matching circuit (5) from the drain terminal normalized by gate width W (mm) of MOS transistor (1), and a real part (RL) of the ZL is $RL > 0.64 \times Vd\_n + 0.19$ (Ω·mm), and $RL < 0.64 \times Vd\_n + 1.73$ (Ω·mm).

8 Claims, 17 Drawing Sheets

FOREIGN PATENT DOCUMENTS

JP  2005-518745  6/2005
JP  2005-259777  9/2005

OTHER PUBLICATIONS

Doan, C.H. et al., "Millimeter-Wave CMOS Design," IEEE Journal of Solid-State Circuits (Jan. 2005), vol. 40, No. 1, pp. 144-155.

Yao, Terry et al., "Algorithmic Design of CMOS LNAs and PAs for 60-GHz Radio," IEEE J. Solid-State Circuits (May 2007), vol. 42, pp. 1044-1057.

Bennett, Herbert S. et al., "Device and Technology Evolution for Si-Based RF Integrated Circuits," IEEE Transactions on Electron Devices (Jul. 2005), vol. 52, No. 7, pp. 1235-1258.

The International Technology Roadmap for Semiconductors: 2005 (ITRS2005).

Bult, Klaas, "Analog Broadband Communication Circuits in Pure Digital Deep Sub-Micron CMOS," IEEE International Solid-State Circuit Conference, Digest (Feb. 1999), pp. 76-77.

International Search Report dated Dec. 9, 2008.

\* cited by examiner

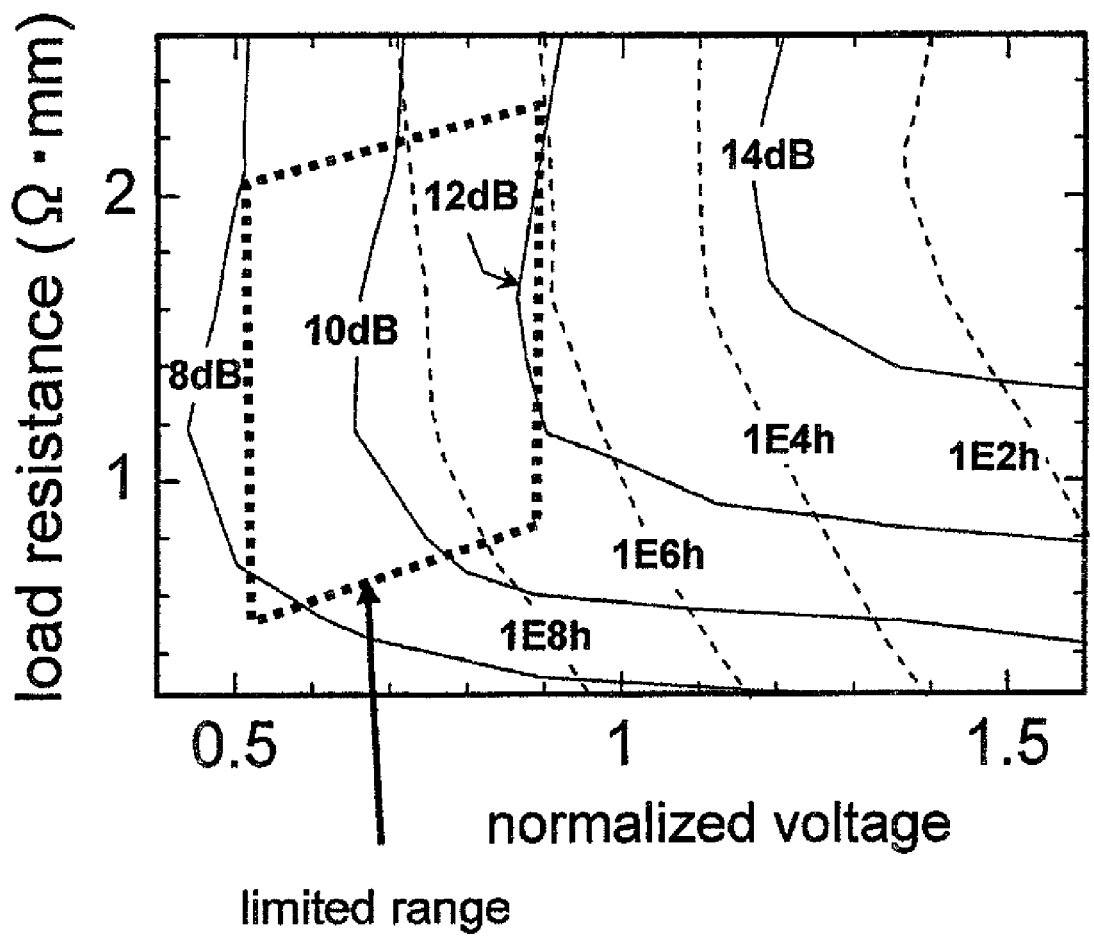

POWER AMPLIFIER, AND METHOD OF CONTROLLING POWER AMPLIFIER

TECHNICAL FIELD

The present invention relates to a power amplifier for use in micro-wave bands and millimeter-wave bands.

BACKGROUND ART

In recent years, wireless devices using broadband millimeter-waves (30 GHz-300 GHz) have been utilized in increasingly wider applications. Wireless technologies using millimeter-waves have been expected to be applied, particularly, to wireless communications of high definition images, and high-speed wireless data communications in a Gigabit class.

Also, millimeter-wave WPAN (Wireless Personal Area Network) has been expected as a high-speed wireless communication network. The millimeter-wave WPAN, which utilizes the directivity of an antenna, assumes a line-of-sight (LOS) communication which involves relatively little multi-path, and a non-line-of-sight (NLOS) communication which involves relatively much multipath.

IEEE802.15.3c, which establishes the standard for millimeter-wave WPAN, contemplates the application of the former LOS communication to ultra-high speed download. In this application, a transmission is performed with a single carrier (single carrier modulation) using, for example, a simple binary modulation, or a quaternary modulation such as QPSK (Quadrature Phase Shift Keying) or the like, to limit power consumption, and it is expected to enable battery-driven operations at a downloading destination.

Also, IEEE802.15.3c contemplates an application of the latter NLOS communication to a uncompressed video streaming and the like, where it is envisaged that communication can still be available even if a person goes across a transmission path into an NLOS environment. In this application, it is expected that high multipath immunity can be achieved by performing a transmission with multiple carriers (multi-carrier modulation), for example, using OFDM (Orthogonal Frequency Division Multiplexing) or the like as secondary modulation.

In this regard, a wireless LAN (2.4 GHz/5 GHz band) using a microwave band at low frequencies expects diffractive and reflective radio waves with rich multi-paths, as compared with millimeter-wave bands, so that there is no thought that the modulation scheme can be switched in accordance with the LOS environment and NLOS environment. However, in some cases, one modulation scheme is selected from BPSK (Binary Phase Shift Keying), QPSK, 16QAM (Quadrature Amplitude Modulation) or 64QAM in accordance with a propagation environment.

In a wireless device applied to applications as mentioned above, a power amplifier equipped in a transmitter within the wireless device is a key technology. While compound semiconductors have been employed for conventional power amplifiers, developments have been in progress for CMOS (Complementary Metal Oxide Semiconductor) based power amplifiers which can operate even in millimeter-wave bands, with the aid of the evolution in miniaturization of silicon semiconductors which are suitable for mass-production, and these CMOS can realize a reduction in cost.

In Non-Patent Document 1, 2 dBm of output power has been generated in a power amplifier for a 60-GHz band using CMOS of 130-nm technology.

However, challenges remain unsolved in power amplifiers mainly used in a front end of a transmitter for increasing the output.

For example, assume that n-channel MOS (nMOS) formed in a CMOS process is used in a power amplifier.

In a power amplifier, as nMOS is increasingly miniaturized in relation to the trend to higher frequencies, a gate oxide film of nMOS must be reduced in thickness, so that the breakdown voltage becomes lower, and a lower supply voltage must be applied thereto.

On the other hand, in a power amplifier of a multi-stage amplifier configuration, a large voltage amplitude or current amplitude must be taken in an amplifier at the last stage in order to increase the output. In a power amplifier, the current does not decrease so much even if the miniaturization of nMOS has progressed, but since the supply voltage must be reduced as mentioned above, a sufficient voltage amplitude cannot be ensured.

In Non-Patent Document 2, 9.3 dBm of output power has been generated in a power amplifier for a 60-GHz band using CMOS of 90-nm technologies.

However, in Non-Patent Document 2, the supply voltage exceeds a generally used supply voltage (1.0-1.2 V), and no consideration is given to reliability which is required in practice use.

Reliability which is problematic in the power amplifier is determined mainly by deterioration in hot carriers of MOS transistors. Hot carrier deterioration refers to a phenomenon in which high-energy carriers accelerated by a high electric field within a channel are trapped by a gate oxide film to cause a change in threshold voltage and transconductance. The degree of hot carrier deterioration can be monitored by the substrate current (Isub) of a MOS transistor.

According to Patent Document 1, accumulation Age of hot carrier deterioration of MOS transistors is represented by the following Equation (1). In this regard, the inverse of Equation (1) is a normalized lifetime of the MOS transistor. Also, Equations (2)-(4) are equations used in calculation of Equation (1).

[Equation 1]

$$\text{Age} = \int \frac{1}{W \cdot H} I_{sub} \left( \frac{I_{sub}}{I_d} \right)^{m-1} dt \quad (1)$$

[Equation 2]

$$I_{sub} = \frac{Ai}{Bi} \cdot (V_d - V_{sat}) \cdot I_d \cdot \exp\left(-\frac{Bi \cdot lc}{V_d - V_{sat}}\right) \quad (2)$$

[Equation 3]

$$V_{sat} = \frac{E_{crti}L(V_{gs} - V_{th})}{E_{crti}L + (V_{gs} - V_{th})} \quad (3)$$

[Equation 4]

$$lc = \sqrt{\frac{\varepsilon_{si} T_{ox} X_j}{\varepsilon_{ox}}} \quad (4)$$

Here, H is a constant, W is a gate width, Vd is a drain voltage, Id is a drain current, Vgs is a gate-source voltage, and Vth is a threshold voltage. Also, m is a coefficient related to impact ionization and interface level generation, and is approximately three. Also, Ai and Bi are constants, $E_{crti}$ is a critical electric field for a saturation speed, L is a channel length, $\varepsilon_{si}$, $\varepsilon_{ox}$ are dielectric constants of a silicon substrate and a gate oxide film, respectively, $T_{ox}$ is the thickness of the gate oxide film, and $X_j$ is a drain junction depth. It should be noted that Equation (1) can also be applied to an RF state in which an RF (Radio Frequency) signal is applied, and to a DC state in which DC (direct current) is applied.

In a miniature MOS transistor which has a high electric field strength in the channel, the impact ionization is more likely to occur, so that the hot carrier deterioration constitutes a particularly grave problem. In particular, in a power amplifier which is required to amplify a voltage amplitude, consideration must be taken not only to just a supply voltage but also to the allowed voltage amplitude from a view point of reliability.

To avoid this problem, an approach called "multi-oxide" is applied to power amplifiers. Multi-oxide is an approach that uses a miniature (short gate length) MOS transistor for amplifiers at the first and subsequent stages that involve low voltage amplitude of signal, and that uses a MOS transistor having a long gate and a thick gate oxide film for an amplifier at the last stage that involves a large voltage amplitude. A long-gate MOS transistor, though exhibiting low performance with respect to gain, efficiency and the like, has a high supply voltage or breakdown, and can therefore contribute to the reliability that is required for the power amplifier.

However, the multi oxide approach can be used in microwave bands, but not in millimeter-wave bands.

FIG. 1 shows the relationship between the gate length (generation) and a maximum oscillation frequency and a supply voltage of a MOS transistor formed in a CMOS process, created on the basis of Non-Patent Document 3, Non-Patent Document 4 and the like (partially including estimation).

For example, assuming that the operation frequency of a power amplifier is 60 GHz, a maximum oscillation frequency (fmax) approximately three times higher is required in an analog circuit, so that a CMOS transistor is used with a gate length of 90 nm and fmax of approximately 200 GHz.

In this event, 1 V, for example, is used as a supply voltage for the power amplifier. However, since an amplifier at the last stage is applied with a voltage approximately twice as high as the supply voltage, a CMOS transistor should be employed with a gate length of at least 240 nm which corresponds to a supply voltage of at least approximately 2 V. However, the fmax of a CMOS transistor having a gate length of 240 nm is merely as low as approximately 40 GHz.

Specifically, FIG. 1 shows that when the operation frequency of the power amplifier is 60 GHz, the gain becomes 0 dB or less, so that a CMOS transistor having a gate length of 240 nm cannot be applied to the amplifier at the last stage.

In this way, the multi-oxide approach is effective for CMOS transistors which have a gate length of approximately 180 nm and fmax of 30 GHz (operation frequency is 10 GHz or lower).

In this regard, similar MOS transistors having a long gate and a thick gate oxide film are applied even for use in the output section of a digital circuit. According to Non-Patent Document 5, it has been pointed out that a critical supply voltage is 1.8 V (180 nm in gate length) when such a MOS transistor is used. This indication also corresponds to an analog circuit.

As described above, the multi-oxide approach cannot be applied to microwave bands at frequencies of approximately 10 GHz or higher and to millimeter-wave (>30 GHz) bands at frequencies higher than microwave bands.

Accordingly, a power amplifier which operates at the aforementioned frequency using a miniature MOS transistor, has a problem of establishing compatibility between an ensured reliability caused by the hot carrier deterioration of the MOS transistor and an increase in the output.

Also, as previously described, it is desired that millimeter-wave bands support both single-carrier modulation and multi-carrier modulation. As well, as previously described, CMOS capable of operating in millimeter-wave bands is preferably used to obtain a lower cost and higher frequencies of a power amplifier. However, in the power amplifier, an increase in output, linearity, and efficiency becomes difficult due to an increasingly progressed miniaturization of CMOS in relation to the trend to higher frequencies, and in relation to a resulting reduction in the supply voltage which can be applied to the power amplifier. Also, in the power amplifier, a large signal amplitude is not permitted due to limitations from the viewpoint of reliability such as hot carrier deterioration and the like.

Accordingly, the power amplifiers which operate at the aforementioned frequency using miniature MOS transistors have challenges in supporting both the aforementioned modulation schemes and increasing the output, linearity, and efficiency under such constraints.

[Patent Document 1] JP-2005-259777-A
[Non-Patent Document 1] C. H. Doan et al., "Millimeter-wave CMOS Design," IEEE Journal of Solid-State Circuits, Vol. 40, pp. 144-155, January 2005.
[Non-Patent Document 2] Terry Yao, et al., "Algorithmic Design of CMOS LNAs and PAs for 60-GHz Radio," IEEE J. Solid-State Circuits, vol. 42, pp. 1044-1057, May 2007.
[Non-Patent Document 3] Herbert S. Bennett et al., "Device and Technology Evolution for Si-Based RF Integrated Circuits," IEEE Transactions on Electron Devices, pp. 1235-1258, Vol. 52, No. 7, July 2005.
[Non-Patent Document 4] The International Technology Roadmap for Semiconductors: 2005 (ITRS2005).
[Non-Patent Document 5] Klaas Bult, "Analog Broadband Communication Circuits in Pure Digital Deep Sub-Micron CMOS," IEEE International Solid-State Circuit Conference, Digest, pp. 76-77, February, 1999.

DISCLOSURE OF THE INVENTION

It is therefore an object of the present invention to provide a power amplifier and a method of controlling a power amplifier for solving each of the problems mentioned above.

To achieve the above object, a power amplifier of the present invention is a power amplifier comprising a MOS transistor having a gate length of 180 nm or less, and an output matching circuit connected to a drain terminal of the MOS transistor. The power amplifier is characterized in that:

the MOS transistor is applied with a voltage Vd_n normalized by a voltage value allowable in a DC state as a drain-source voltage, where Vd_n is in a range of 0.5 to 0.9;

ZL (=RL+j·XL) represents a value equal to a load impedance when viewing the output matching circuit from the drain terminal normalized by gate width W (mm) of the MOS transistor; and a real part (RL) of the ZL is RL>0.64×Vd_n+0.19 (Ω·mm), and RL<0.64×Vd_n+1.73 (Ω·mm).

Advantageously, according to the present invention, high output power and long-term reliability (lifetime) can be simultaneously achieved in a power amplifier which employs a MOS transistor.

BRIEF DESCRIPTION OF THE DRAWINGS

FIG. 7 is a diagram showing contour lines of output power (solid lines) and lifetime (broken lines) when the ordinate and abscissa represent a normalized voltage and a load resistance, respectively, in a MOS transistor having a gate length of 90 nm which is used in a first example of a power amplifier of this embodiment;

BEST MODE FOR CARRYING OUT THE INVENTION

In the following, the best mode for carrying out the present invention will be described with reference to the drawings.

[Configuration of Power Amplifier]

First Example

A description will be given of a first example of a power amplifier according to an embodiment.

Figure 1:
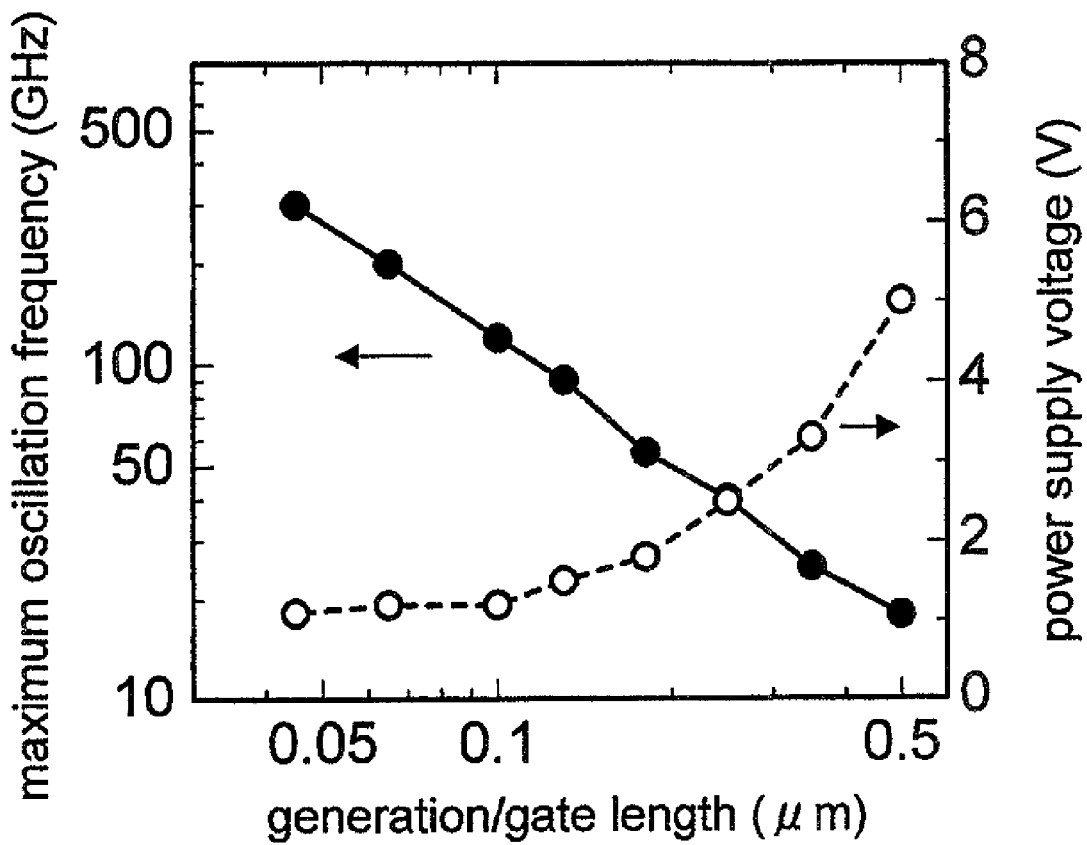
FIG. 1 is a diagram showing a maximum oscillation frequency and a gate length dependence of a supply voltage in a MOS transistor.
Figure 2:
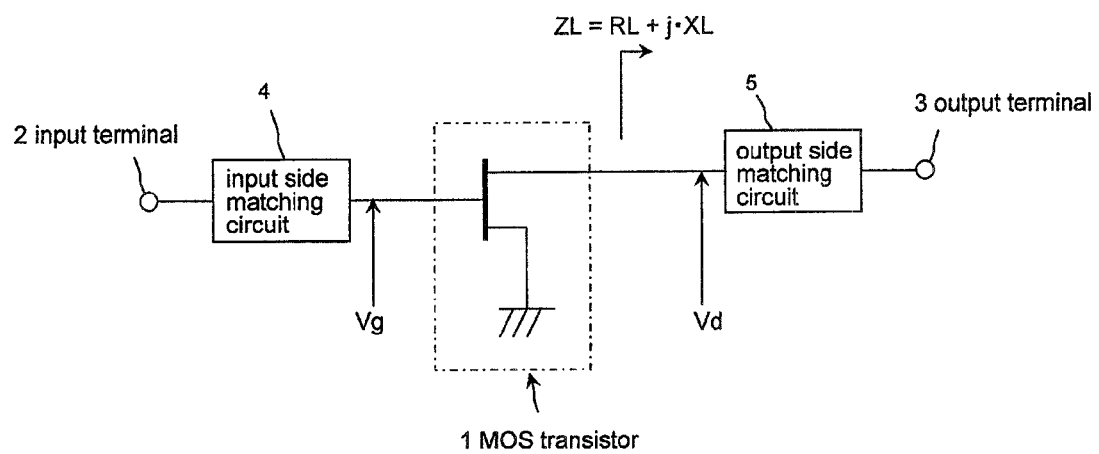
FIG. 2 is a diagram showing the configuration of a first and a second example of a power amplifier according to an embodiment.

FIG. 2 shows the configuration of the first example of the power amplifier according to this embodiment. Specifically, FIG. 2 shows the configuration when the power amplifier is a single-stage amplifier or the configuration of one stage when the power amplifier is a multi-stage amplifier.

Referring to FIG. 2, the power amplifier of this example employs MOS transistor 1 as an active element.

A signal applied from input terminal 2 is applied to a gate terminal of MOS transistor 1 through input matching circuit 4. An output signal is output from output terminal 3 through a drain terminal of MOS transistor 1 and output matching circuit 5.

ZL (=RL+j·XL) defines a load impedance when viewing output matching circuit 5 from the drain terminal of MOS transistor 1 normalized by gate width W (mm) of the MOS transistor.

From a bias circuit, not shown, appropriate potentials (biases) are applied to the gate terminal and drain terminal of MOS transistor 1, respectively.

Figure 3:
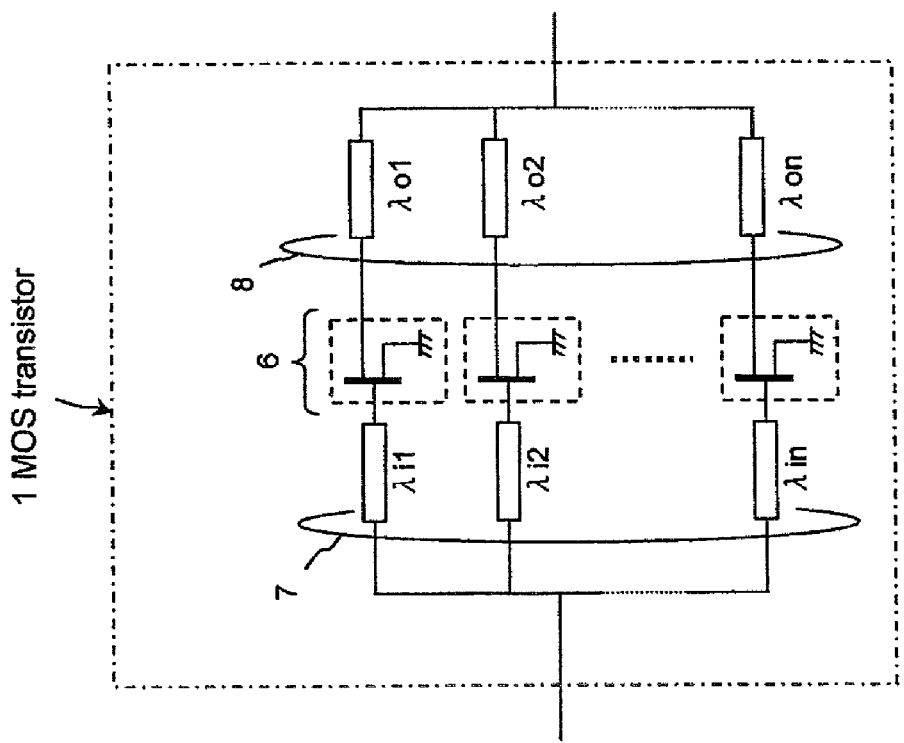
FIG. 3 is a diagram showing the configuration of a MOS transistor shown in FIG. 2.

FIG. 3 shows a cell configuration of MOS transistor 1.

Referring to FIG. 3, MOS transistor 1 is divided into a plurality of transistor cells 6 each comprising a drain electrode, a source electrode, and a gate electrode (gate finger).

In ultra-high frequency operation, the distances from each transistor cell 6 to a connection point to which a plurality of lines 7, 8 are connected, i.e., the lengths of the plurality of lines 7, 8 are important. When electric lengths of the plurality of lines 7, 8 are respectively one tenth wavelength or less at the operation frequency of the power amplifier, a favorable power combination can be made. In this event, the aforementioned ZL can be defined to be a load impedance of output matching circuit 5 as viewed from a connection point of line 8 on the output side.

Figure 4A:
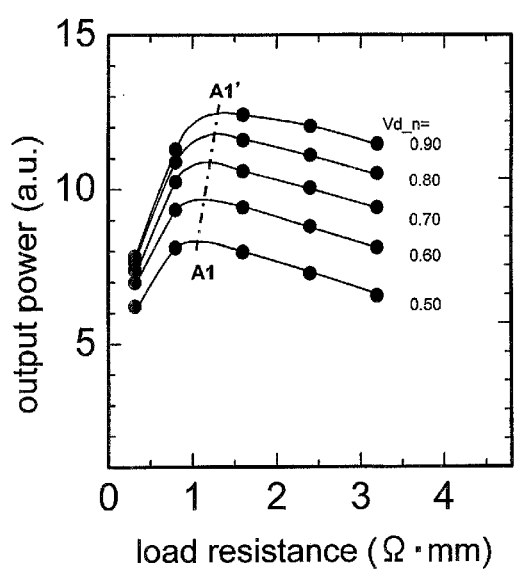
FIG. 4A is a diagram showing a load resistance dependence of output power in a MOS transistor having a gate length of 90 nm.
Figure 4B:
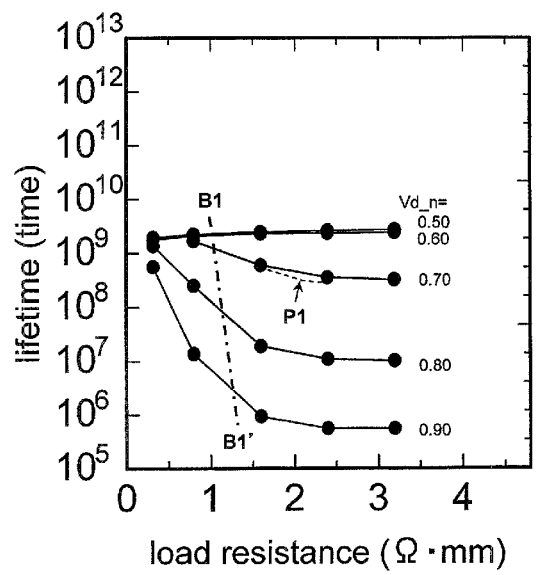
FIG. 4B is a diagram showing a load resistance dependence of a lifetime in a MOS transistor having a gate length of 90 nm.

FIGS. 4A and 4B show load resistance (RL) dependence of output power and RL dependence of lifetime, respectively, which are calculated for an nMOS transistor having a gate length of 90 nm, which was formed in a CMOS process.

In this regard, in FIGS. 4A and 4B, the lifetime is defined to be the time until a drain current of one half of MOS transistors that are to be calculated decreases by 10%. Also, for the calculation, the level before the output power saturates was selected as input power, and the load reactance (XL) normalized by the gate width was set to zero. Also, normalized voltage $Vd\_n$ is indicated as a parameter. $Vd\_n$ is a voltage applied between the drain and source of MOS transistor 1, and is normalized by maximum value Vddmax of a supply voltage (value permitted in a DC state or value defined in an RF non-input state) permitted in a DC state. For example, in 90-nm technologies, 1 V or 1.2 V is generally used as Vddmax.

Referring to FIG. 4A, the output power does not depend on $Vd\_n$, and RL reaches a maximum value (peak) near 1.3 Ω·mm. A line which connects RLs at which the output power reaches the peak on each $Vd\_n$ is indicated by line A1-A1'. Also, the output power heavily depends on the value of RL, and a range for optimal RL is narrow.

Also, referring to FIG. 4B, a line which connects RLs corresponding to line A1-A1' in FIG. 4A on each Vd_n is indicated by line B1-B1'. While the lifetime presents a large dependence on RL in a range of Vd_n from 0.7 to 0.9, a sufficient lifetime of $1\times10^6$-$1\times10^8$ hours is ensured for semiconductor devices.

Figure 5A:
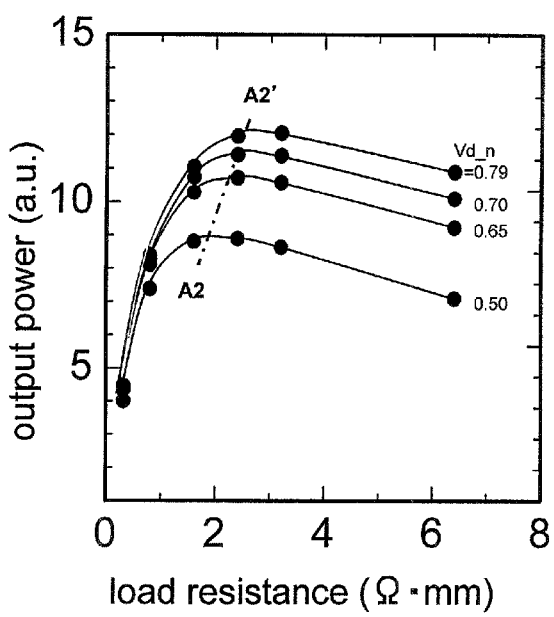
FIG. 5A is a diagram showing a load resistance dependence of output power in a MOS transistor having a gate length of 180 nm.
Figure 5B:
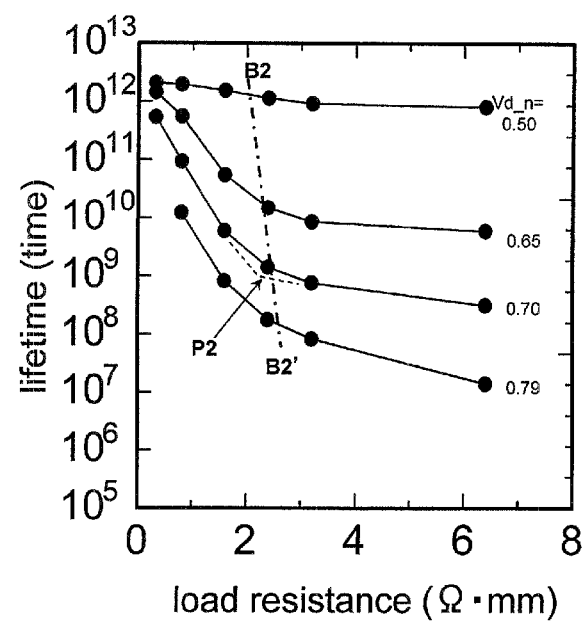
FIG. 5B is a diagram showing a load resistance dependence of a lifetime in a MOS transistor having a gate length of 180 nm.

Also, FIGS. 5A and 5B show RF dependence of the output power and RF dependence of lifetime, respectively, calculated for an nMOS transistor having a gate length of 180 nm, formed in a CMOS process, for comparison with FIGS. 4A and 4B. Likewise, FIG. 5A also indicates a line which connects RLs at which the output voltage reaches the peak by line A2-A2', and FIG. 5B also indicates a line which connects RLs corresponding to line A2-A2' in FIG. 5A by line B2-B2'.

Figure 6A:
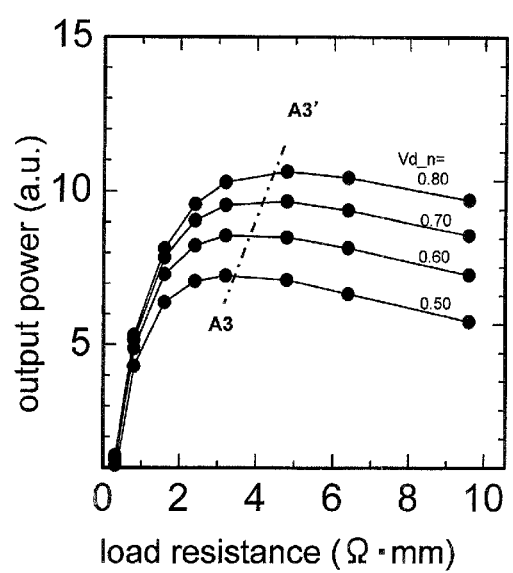
FIG. 6A is a diagram showing a load resistance dependence of output power in a MOS transistor having a gate length of 350 nm.
Figure 6B:
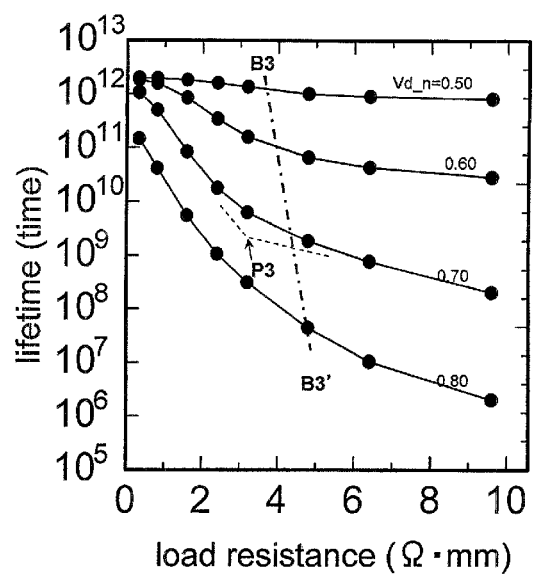
FIG. 6B is a diagram showing a load resistance dependence of a lifetime in a MOS transistor having a gate length of 350 nm.

Further, FIGS. 6A and 6B show RL dependence of the output power and RL dependence of lifetime, respectively, calculated for an nMOS transistor having a gate length of 350 nm, formed in a CMOS process, for comparison with FIGS. 4A and 4B. Likewise, FIG. 6A also indicates a line which connects RLs at which the output voltage reaches the peak by line A3-A3', and FIG. 6B also indicates a line which connects RLs corresponding to line A3-A3' in FIG. 6A by line B3-B3'.

Referring to FIGS. 4B, 5B, and 6B, the lifetime deteriorates as RL increases, and the proportion of the deterioration becomes slower when a certain RL is exceeded in any of these graphs. For defining RL when the RL dependence of the lifetime fluctuates, a straight line which approximately draws a curve in a lower RL region and a straight line which approximately draws a curve in a higher RL region are extrapolated in each graph to find intersections (P1, P2, P3) of the two straight lines. For example, comparing at a point Vd_n=0.7, P1 is situated on the right side of line B1-B1' when the gate length is 90 nm; P2 is situated near line B2-B2' when the gate length is 180 nm; and P3 is situated on the left side of line B3-B3' when the gate length is 350 nm.

Specifically, it is understood that with a miniature gate having a gate length of 90 nm as shown in FIG. 4B, the lifetime presents a strong RL dependence because P1 is situated on the right side of line B1-B1' on which the peak output power can be generated. In this event, accordingly, consideration should be given both RL and lifetime.

Also, when the gate length is a long gate of 350 nm, as shown in FIG. 6B, P3 is situated on the left side of line B3-B3', from which it is understood that the lifetime does not heavily depend on RL. In this event, accordingly, the lifetime is determined roughly in dependence on Vd_n (supply voltage) rather than dependence on RL.

On the other hand, when the gate length is 180 nm as shown in FIG. 5B, P2 is situated near line B2-B2'. It is understood from this fact that the boundary to which the RL dependence of the lifetime fluctuates is roughly at the gate length of 180 nm.

Based on this knowledge, Vd_n and RL can be limited to optimal ranges from the viewpoint of the output power and lifetime.

FIG. 7 shows contour lines of the output power (relative value, solid lines) and contours (broken lines) of the lifetime with the abscissa representing normalized voltage Vd_n and the ordinate representing the load resistance (RL) in the MOS transistor. In this event, MOS transistor 1 has a gate length of 90 nm.

Here, Vd_n and RL are limited in ranges in which the output power is high, and a sufficiently long lifetime can be ensured, based on FIG. 7.

First, a sufficient lifetime of $1\times10^6$ hours or longer is ensured when Vd_n is approximately 0.9 or less. Next, quoting FIG. 4B, it is understood that the lifetime is improved if Vd_n is reduced, but the lifetime is not improved and the output power monotonously decreases if Vd_n is equal to or less than 0.5. Accordingly, Vd_n is limited to a range between 0.5 and 0.9 because it is optimal within this range.

RL, in turn, is limited to ranges roughly represented by RL>0.64×Vd_n+0.19 (Ω·mm) and RL<0.64×Vd_n+1.73 (Ω·mm).

In the range to which Vd_n and RL are limited in this way (range represented by a parallelogram in FIG. 7, which is hereinafter called the "limited range"), the contour lines of the output power extend to the lower left, as compared with the contours of the lifetime. This indicates that a higher output power can be provided even with the same lifetime.

For example, when viewing the dotted line on which the lifetime is $1\times10^8$ hours in FIG. 7, the output power (relative value) is generally larger than 10 dB within the limited range, while the output power decreases even when the same lifetime is outside of the limited range. This behavior corresponds to the RL dependence of the output power and lifetime shown in FIGS. 4A and 4B, respectively.

Summarizing the foregoing, it has been found out that in MOS transistor 1 having a miniature gate, the lifetime presents a strong RL dependence in a range of RL in which the output power is high, the boundary to which the RL dependence of the lifetime fluctuates is roughly at the gate length of 180 nm, and if RL is limited under appropriate Vd_n, high output power and a sufficiently long lifetime can be provided utilizing the RL dependence.

Accordingly, in the power amplifier of this example, output matching circuit 5 is designed to provide Vd_n and RL which fall within the limited range in FIG. 7.

Also, in the power amplifier of this example, the definition of the load impedance (ZL) is important. As described above, when the electric length of line 8 is roughly one tenth wavelength or less in FIG. 3, a reference point for viewing a load impedance can be defined at a connection point of line 8. On the other hand, when the electric length of line 8 is larger than one tenth wavelength, it is proper to regard a load impedance on the output side, viewed from each transistor cell 6 as ZL (actually, ZL/W is given as the impedance of the matching circuit). Also, if any element is inserted anywhere from transistor cell 6 to the connection point of line 8, it is proper to regard the load impedance when viewing the output side from the reference point in front of the element (closer to transistor cell 6) as ZL.

Next, an exemplary method of calculating the lifetime is shown. Age is calculated by Equation (5) using lifetime $\tau_0$ in the DC state, and $I_{sub\_0}$, $I_{d\_0}$ when the lifetime $\tau_0$ was measured.

[Equation 5]

$$\text{Age} = \frac{1}{W \cdot H} I_{sub\_0} \left( \frac{I_{sub\_0}}{I_{d\_0}} \right)^{m-1} \tau_0 \quad (5)$$

When the same Age is given in high frequency operation, Equation (1) is equal to Equation (5), so that an equation including lifetime τ in an RF state is given by the following Equation (6):

[Equation 6]

$$\int_0^\tau I_{sub}\left(\frac{I_{sub}}{I_d}\right)^{m-1} dt = I_{sub\_0}\left(\frac{I_{sub\_0}}{I_{d\_0}}\right)^{m-1} \tau_0 \quad (6)$$

Assuming a CW (continuous wave) at frequency f, Equation (6) is transformed to the following Equation (7):

[Equation 7]

$$(\tau \cdot f)\int_0^{1/f} I_{sub}\left(\frac{I_{sub}}{I_d}\right)^{m-1} dt = I_{sub\_0}\left(\frac{I_{sub\_0}}{I_{d\_0}}\right)^{m-1} \tau_0 \quad (7)$$

Also, τ is represented by the following Equation (8):

[Equation 8]

$$\tau = \frac{I_{sub\_0}\left(\frac{I_{sub\_0}}{I_{d\_0}}\right)^{m-1} \tau_0}{f \int_0^{1/f} I_{sub}\left(\frac{I_{sub}}{I_d}\right)^{m-1} dt} \quad (8)$$

Here, if conditions shown in Equation (9) are established, τ can be simplified as represented by Equation (10):

[Equation 9]

$$\begin{cases} I_{sub}/I_d < 1 \\ \left(\frac{I_{sub}}{I_d}\right)^{m-1} < 1 \end{cases} \quad (9)$$

[Equation 10]

$$\tau > \frac{I_{sub\_0}\left(\frac{I_{sub\_0}}{I_{d\_0}}\right)^{m-1} \tau_0}{f \int_0^{1/f} I_{sub} dt} \quad (10)$$

The foregoing equations are simply used in an example of the lifetime calculation, and may be modified or changed.

In the power amplifier of this example as described above, in the power amplifier which employs MOS transistor 1 having a gate length of 180 nm or less, both high output power and long lifetime can be simultaneously achieved by setting Vd_n to 0.5-0.9, and by setting RL to RL>0.64×Vd_n+0.19 (Ω·mm) and to RL<0.64×Vd_n+1.73 (Ω·mm).

In addition, when the power amplifier of this example is configured to have amplifiers at multiple stages, they may be combined either in series or in parallel.

Also, the power amplifier of this example preferably employs n-channel MOS (nMOS) capable of high-speed operations for MOS transistor 1.

Also, the power amplifier of this example is particularly effective when it employs MOS transistor 1 having a gate length of 180 nm or less, to which the multi-oxide technology cannot be applied, where preferred applicable frequencies are in a microwave range at 10 GHz or higher or in a millimeter-wave range at 30 GHz or higher.

Second Example

A description will be given of a second example of a power amplifier according to this embodiment. It should be noted that the power amplifier of this example is similar in configuration itself to the first example shown in FIG. 2.

The power amplifier of this example also limits the load reactance (XL) in addition to limiting Vd_n and RL in a manner similar to that of the first example.

Figure 8A:
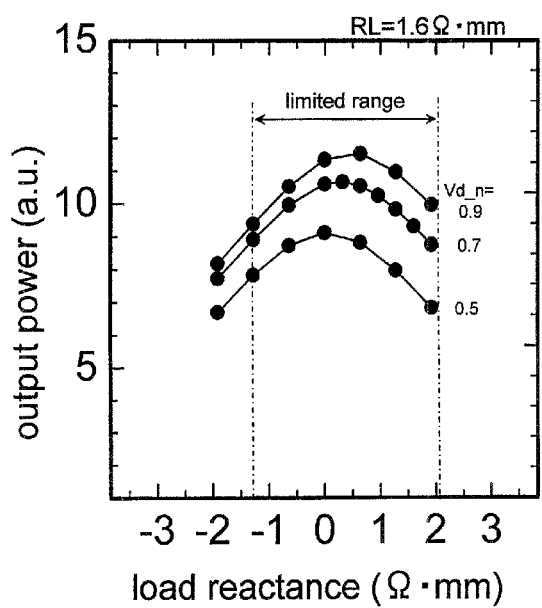
FIG. 8A is a diagram showing a load reactance dependence of output power in a MOS transistor having a gate length of 90 nm which is used in a second example of a power amplifier of this embodiment.
Figure 8B:
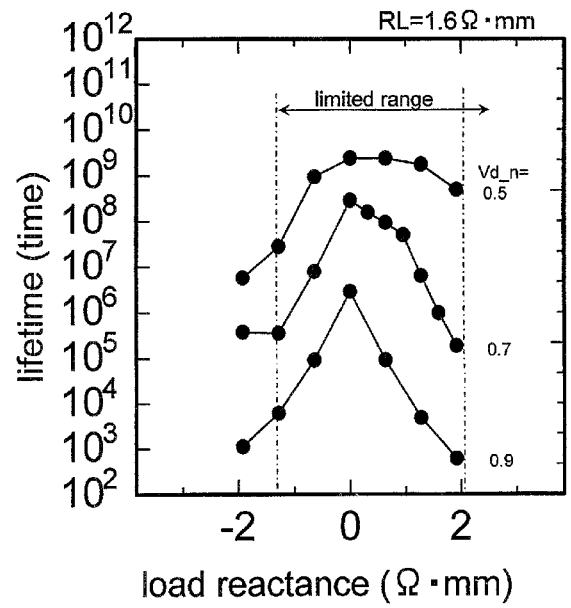
FIG. 8B is a diagram showing a load reactance dependence of lifetime in a MOS transistor having a gate length of 90 nm which is used in a second example of a power amplifier of this embodiment.

FIGS. 8A and 8B show XL dependence of the output power and XL dependence of lifetime calculated for MOS transistor 1 formed in a CMOS process. In this event, MOS transistor 1 has a gate length of 90 nm, and RL is 1.6 (Ω·mm).

Referring to FIGS. 8A and 8B, the output power becomes larger when XL is near substantially zero, where the lifetime also becomes longer. It is also apparent that the lifetime has a strong dependence on XL, and that the lifetime presents a favorable value roughly in a range of XL>−1.28 (Ω·mm) and XL<2.05 (Ω·mm). Accordingly, XL is limited to this range.

Consequently, in the power amplifier of this example, output matching circuit 5 is designed such that XL is given in the foregoing range in addition to the condition in the first example.

Third Example

A description will be given of a third example of a power amplifier according to this embodiment.

Figure 9:
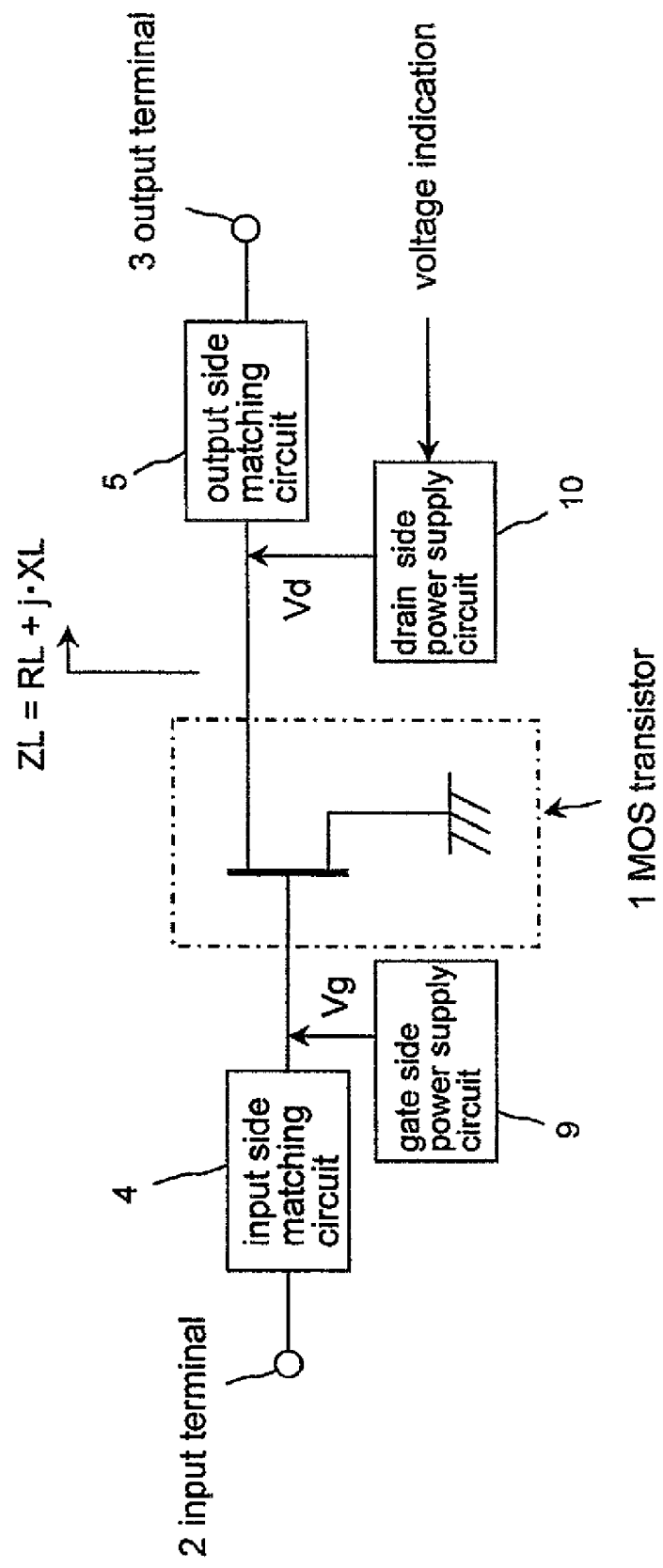
FIG. 9 is a diagram showing the configuration of a third example of a power amplifier of this embodiment.

FIG. 9 shows the configuration of the third example of the power amplifier of this embodiment. Specifically, FIG. 9 shows the configuration when the power amplifier is a single-stage amplifier or the configuration of one stage when the power amplifier is a multi-stage amplifier.

Referring to FIG. 9, the power amplifier of this example employs MOS transistor 1 as an active element.

A signal applied from input terminal 2 is applied to a gate terminal of MOS transistor 1 through input matching circuit 4. An output signal is output from a drain terminal of MOS transistor 1 through output matching circuit 5 from output terminal 3.

ZL (=RL+j·XL) defines a value equal to a load impedance when viewing output matching circuit 5 from the drain terminal of MOS transistor 1 normalized by gate width W (mm) of the MOS transistor.

Also, MOS transistor 1 has a gate terminal and a drain terminal connected to gate power supply circuit 9 and to drain power supply circuit 10, respectively, which are controlled from the outside.

At least drain power supply circuit 10, among others, can change a voltage applied between the drain and source in response to a power supply voltage indication from the outside.

Then, for single-carrier modulation (ASK (Amplitude Shift Keying), FSK (Frequency Shift Keying), BPSK, QPSK, eight-phase PSK, 16QAM), the reliability and high output characteristics are simultaneously achieved by setting voltage Vd_n normalized by a voltage value allowable in a DC state to 0.5-0.9, and by applying the same as a drain-source voltage.

On the other hand, for multi-carrier modulation, Vd_n is set to 0.9-1 and applied as a drain-source voltage, thereby realizing higher linearity (higher saturation output) to simultaneously achieve both low-distortion characteristics and high output characteristics. As a result, optimal operations can be performed in each of the modulation schemes, and a higher efficiency can also be realized.

In the following, the operation of the power amplifier of this embodiment will be described in detail.

As described above, it has been found out that in MOS transistor 1 having a miniature gate, the lifetime presents a strong RL dependence in a range of RL in which the output power is high, the boundary to which the RL dependence of the lifetime fluctuates is roughly at the gate length of 180 nm, and if RL is limited under appropriate Vd_n, high output power and a sufficiently long lifetime can be provided utilizing the RL dependence.

In other words, the condition for the power amplifier of this example is similar to that of the second example, where MOS transistor 1 is applied with voltage Vd_n as a drain-source voltage, where Vd_n is normalized by a voltage value allowable in the DC state, and set to 0.5-0.9. Also, ZL(=RL+j·XL) represents a value resulting from normalization of a load impedance when viewing output matching circuit 5 from the drain terminal by gate width W (mm) of MOS transistor 1, where the real part (RL) of ZL is RL>0.64×Vd_n+0.19 (Ω·mm), and RL<0.64×Vd_n+1.73 (Ω·mm). Further, the imaginary part (XL) of ZL is XL>−1.28 (Ω·0 mm) and XL<2.05 (Ω·mm).

This condition is based on the assumption that the power amplifier is applied with a single carrier modulation signal which has undergone FSK, BPSK, QPSK or the like as equi-amplitude modulation, and is based on the knowledge which was obtained on a level of input power at the time before the output power saturates.

On the other hand, with a multi-carrier modulation signal which has undergone OFDM as secondary modulation, there is a large difference between peak power and average power, and the operation level becomes low as viewed at the average power. For example, the power amplifier may sometimes be operated at an operation level that is lower by 10 dB or more than the saturation output level. In this event, since the average output power becomes lower, no problem will arises in regard to reliability even if Vd_n is set to 0.9-1.0 which is applied as a source-drain voltage of MOSFET.

Figure 10:
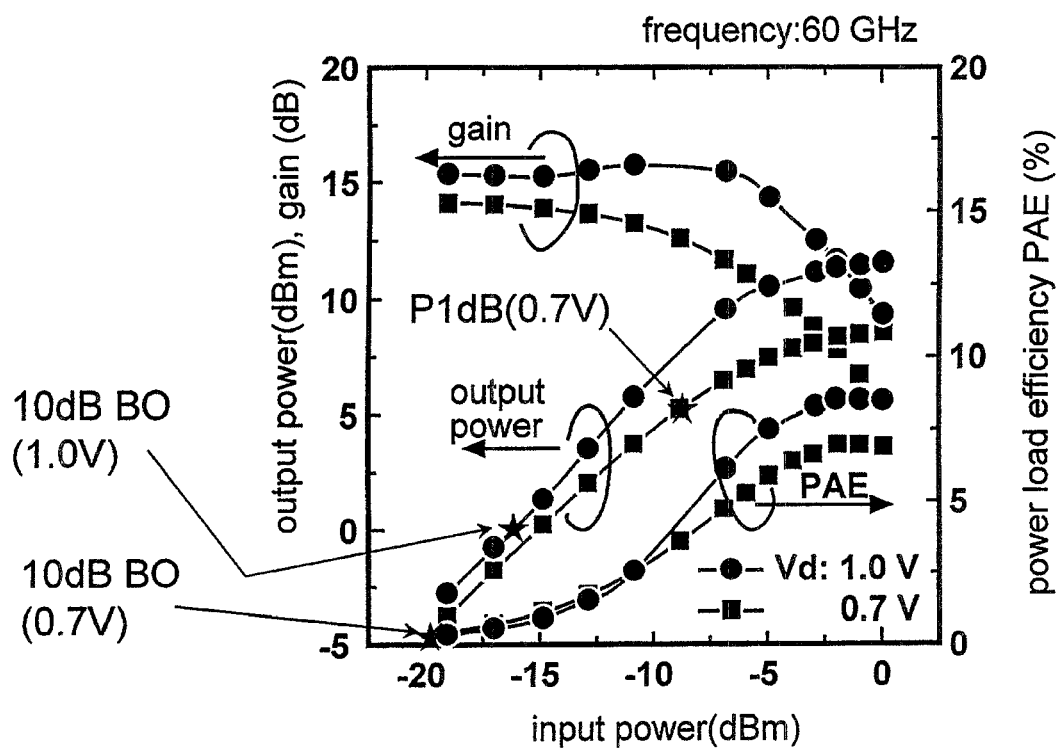
FIG. 10 is a diagram showing an input power dependence of output power, gain, power load efficiency when a MOS transistor having a gate length of 90 nm is used in the third example of the power amplifier of this embodiment.

FIG. 10 shows input power dependence of the output power, gain, and power load efficiency in a power amplifier (CMOS amplifier configured in three stages for 60-GHz band) which employs MOS transistor 1 having a gate length of 90 nm.

In single-carrier modulation (QPSK), when Vd_n is set to 0.7 (Vd=0.7V), the output power of 6 dBm and a power load efficiency (PAE) of 3% can be achieved at a gain of 1 dB compressed point (P1 dB). This output power is maximized under a condition in which the reliability is ensured.

On the other hand, in multi-carrier modulation, if operation is required at a point 10 dB lower than P1 dB (10 dB BO) for low distortion operation, the generated output power is −5 dBm when Vd_n=0.7 (Vd=0.7V), and 0 dBm when Vd_n=1 (Vd=1V), and is largely improved by increasing the voltage. Also, the power load efficiency is improved from less than 1% to approximately 1%. In this event, since the output power is smaller than that in the single-carrier modulation, no problem will arise in regard to reliability.

Figure 11:
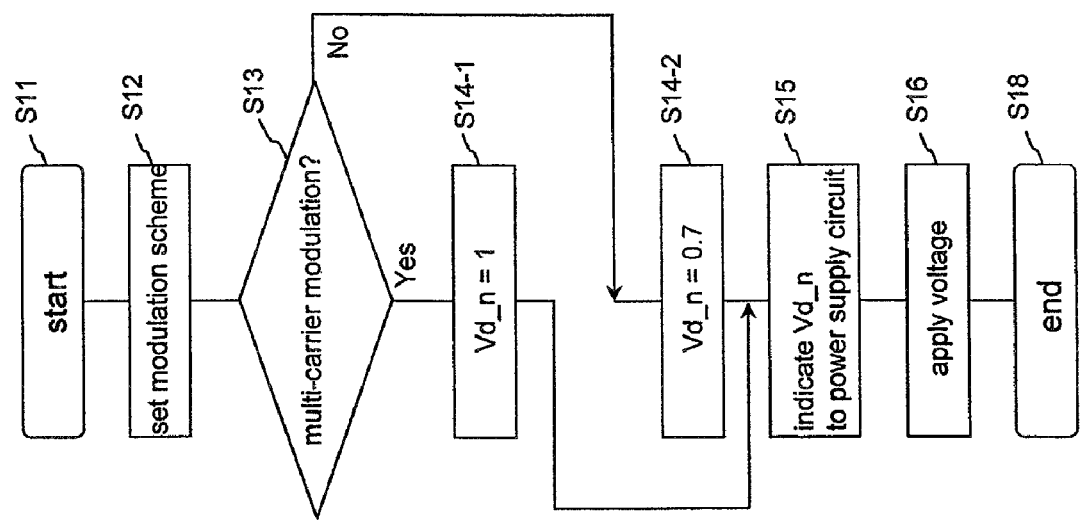
FIG. 11 is a flow chart for describing a control method in the third example of the power amplifier of this embodiment.

FIG. 11 shows a flow chart for describing a method of controlling the power amplifier of this example. Specifically, FIG. 11 shows a control method performed by a wireless device which includes the power amplifier of this example.

Referring to FIG. 11, at the outset of the control for the power amplifier (S11), a modulation scheme is set based on the setting (S12), and it is determined whether or not a signal applied to the power amplifier is a multi-carrier modulation signal (S13). When a multi-carrier modulation signal is applied, Vd_n is set, for example, to 1 (S14-1). On the other hand, when a single-carrier modulation signal is applied, Vd_n is set, for example, to 0.7 (S14-2). Subsequently, drain power supply circuit 10 is instructed to output Vd_n of this value (S15), and MOS transistor 1 is applied with Vd_n from drain power supply circuit 10 (S16). Thus, control for the power amplifier is terminated (S18), followed by the start of wireless communications. By these operations, an optimal voltage is set as previously described.

According to the power amplifier of this example as described above, by controlling the drain-source voltage of MOS transistor 1 corresponding to the two modulation schemes, i.e., the single-carrier modulation and multi-carrier modulation, high performance can be achieved in the respective modulation schemes.

Fourth Example

A description will be given of a fourth example of a power amplifier according to this embodiment.

Figure 12:
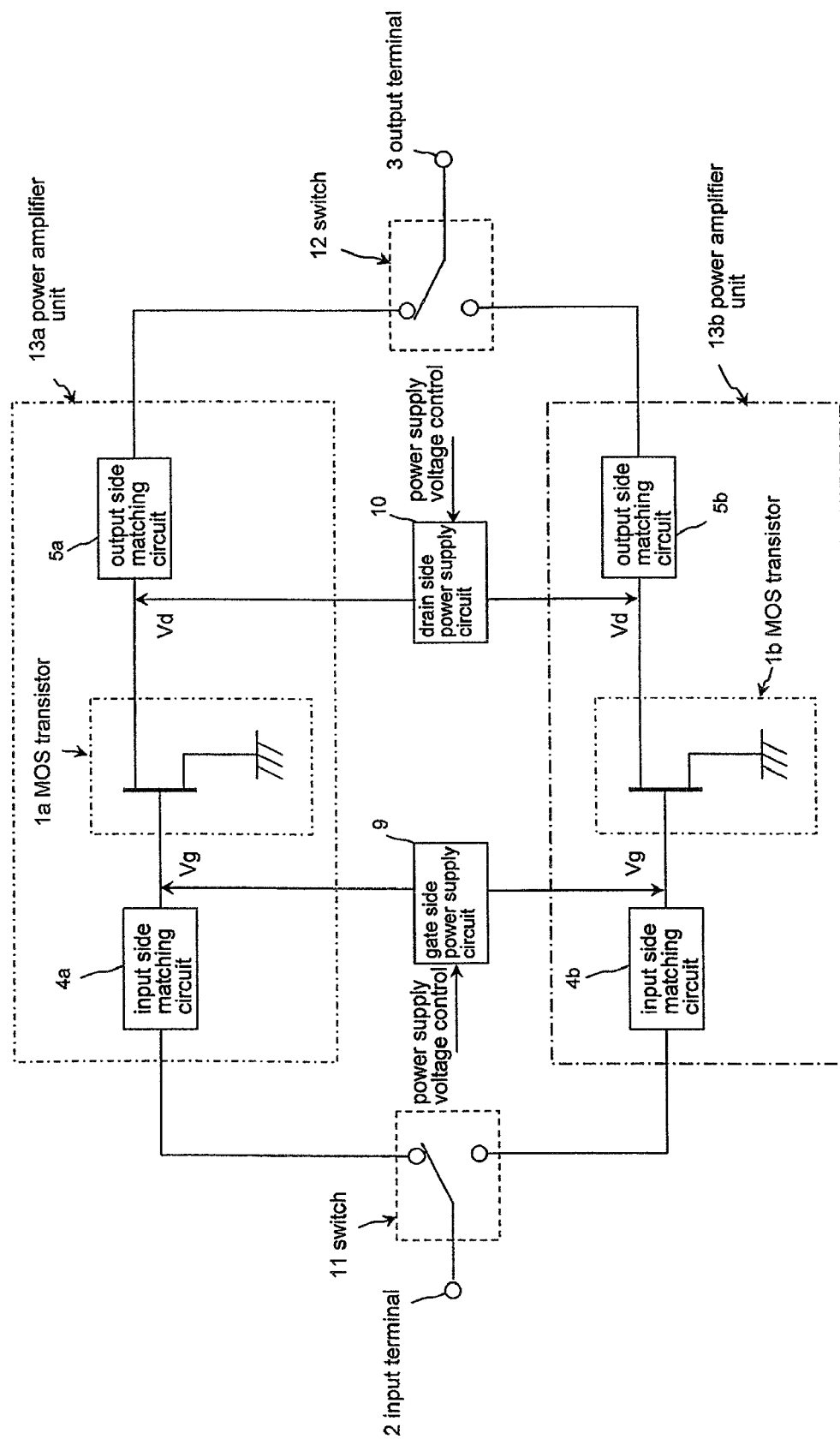
FIG. 12 is a diagram showing the configuration of a fourth example of a power amplifier of this embodiment.

FIG. 12 shows the configuration of the fourth example of the power amplifier of this embodiment. Specifically, FIG. 12 shows the configuration when the power amplifier is a single-stage amplifier or the configuration of one stage when the power amplifier is a multi-stage amplifier.

Referring to FIG. 12, the power amplifier of this example is provided with two power amplifier units 13*a*, 13*b*.

In power amplifier units 13*a*, 13*b*, MOS transistors 1*a*, 1*b* are employed, respectively, as active elements.

A signal applied from input terminal 2 is applied to one of power amplifier units 13*a*, 13*b* through switch 11 which is controlled from the outside.

The signal applied to power amplifier unit 13*a* is applied to a gate terminal of MOS transistor 1*a* through input matching circuit 4*a*, and output from a drain terminal of MOS transistor 1*a* through output matching circuit 5*a*.

On the other hand, the signal applied to power amplifier unit 13*b* is applied to a gate terminal of MOS transistor 1*b* through input matching circuit 4*b*, and output from a drain terminal of MOS transistor 1*b* through output matching circuit 5*b*.

The signal output from each power amplifier unit 13*a*, 13*b* is switched by switch 12, which is similarly controlled from the outside, and output from output terminal 3.

Also, MOS transistor 1*a*, 1*b* has the gate terminal and drain terminal connected to gate power supply circuit 9 and drain power supply circuit 10, which are controlled from the outside, respectively.

At least drain power supply circuit 10, among others, can change a voltage applied between the drain and source in response to a power supply voltage indication from the outside.

The power amplifier of this example can be externally controlled to select a power amplifier unit, and to set a drain-source voltage applied to the MOS transistor within the selected power amplifier unit.

The power amplifier of this example is based on the same concept as the third example, but differs in the following aspects.

Specifically, the power amplifier of this example comprises a plurality of power amplifier units applied with different voltages, which are comparable to the power amplifier of the third example, where at least one power amplifier unit is a single-carrier power amplifier unit which is applied with a single-carrier modulation signal, and at least one power amplifier unit different from this is a multi-carrier power amplifier unit which is applied with a multi-carrier modulation signal. Then, based upon whether the multi-carrier modulation signal or single-carrier modulation signal is applied to the power amplifier, the single carrier power amplifier unit or multi-carrier power amplifier unit is selected and switched.

Figure 13:
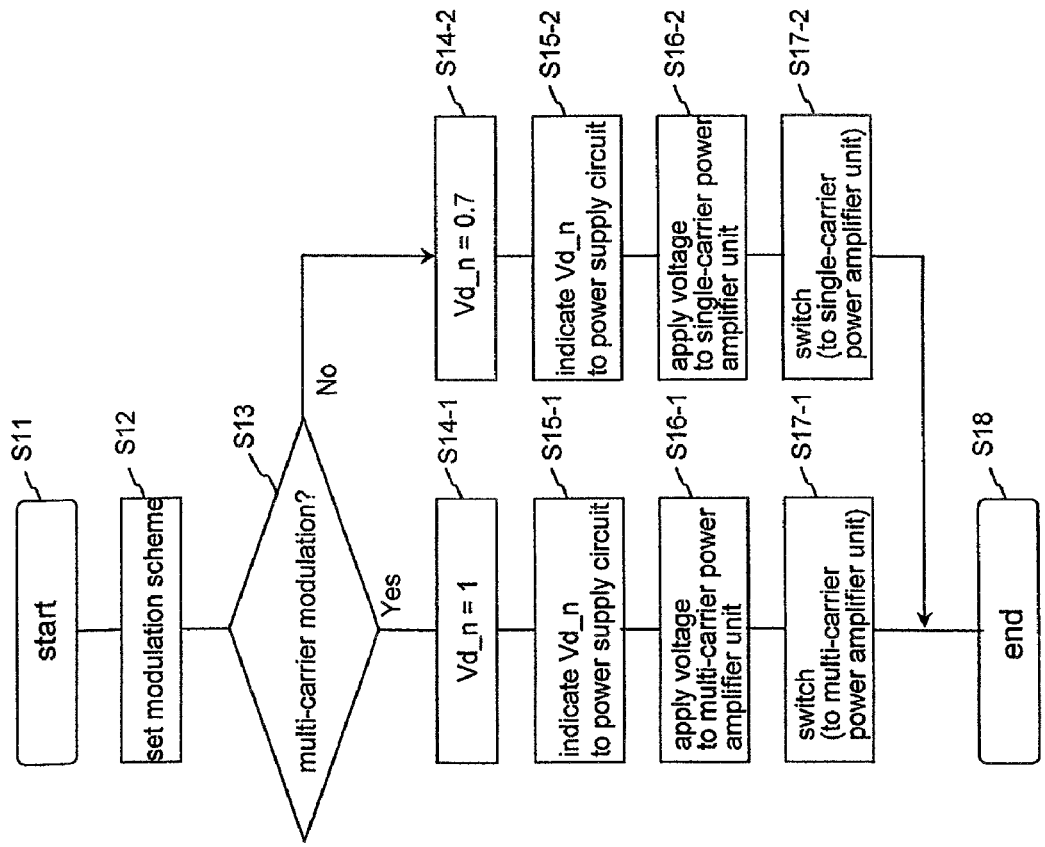
FIG. 13 is a flow chart for describing a control method in the fourth example of the power amplifier of this embodiment.

FIG. 13 shows a flow chart for describing a method of controlling the power amplifier of this example. Specifically, FIG. 13 shows a control method performed by a wireless device which includes the power amplifier of this example. Also, assume in the following that power amplifier unit 13a is a multi-carrier power amplifier unit, and power amplifier unit 13b is a single-carrier power amplifier unit.

Referring to FIG. 13, at the outset of the control for the power amplifier (S11), a modulation scheme is set (S12), and it is determined whether or not a signal applied to the power amplifier is a multi-carrier modulation signal based on the setting (S13). When a multi-carrier modulation signal is applied, Vd_n is set, for example, to 1 (S14-1), drain power supply circuit 10 is instructed to output Vd_n of this value to multi-carrier power amplifier unit 13a (S15-1), Vd_n is applied to MOS transistor 1a within power amplifier unit 13a from drain power supply circuit 10 (S16-1), and switches 11, 12 are switched to select multi-carrier power amplifier unit 13a (S17-1). Thus, the control for the power amplifier is terminated (S18), followed by the start of wireless communications. On the other hand, when a single-carrier modulation signal is applied, Vd_n is set, for example, to 0.7 (S14-2), drain power supply circuit 10 is instructed to output Vd_n of this value to single-carrier power amplifier unit 13b (S15-2), MOS transistor 1b within power amplifier unit 13b is applied with Vd_n from drain power supply circuit 10 (S16-2), and switches 11, 12 are switched to select single-carrier power amplifier unit 13b (S17-2). Thus, the control for the power amplifier is terminated (S18), followed by the start of wireless communications.

According to the power amplifier of this example as described above, by switching and using power amplifier units 13a, 13b which comprise MOS transistors 1a, 1b, respectively, which differ in drain-source voltage, in relation to the two modulation schemes, i.e., the single-carrier modulation and multi-carrier modulation, high performance can be achieve in the respective modulation schemes.

In this regard, while particular values are used for Vd_n in the third and fourth examples, Vd_n may be set from 0.5 to 0.9 for the single-carrier modulation, and a value larger than that for the single-carrier modulation may be set for the multi-carrier modulation. Also, in view of the accuracy and the like of the normal power supply voltage, Vd_n is preferably between 0.9 and 1 for the multi-carrier modulation, taking into consideration fluctuations of 10%.

Also, while the third and fourth examples have shown exemplary control methods, the present invention is not limited to the foregoing control methods as long as Vd_n can be changed or the power amplifier units can be switched in accordance with the modulation schemes.

[Method of Designing Power Amplifier]

First Example

A description will be given of a first exemplary method of measuring a power amplifier according to this embodiment.

Figure 14:
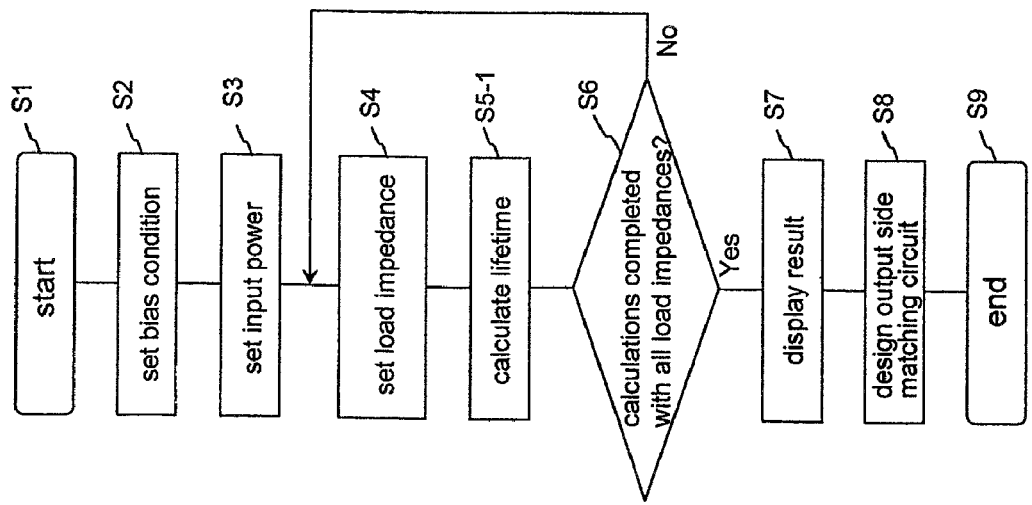
FIG. 14 is a flow chart for describing a first example of a method of designing a power amplifier of this embodiment.

FIG. 14 shows a flow chart for describing (part of) the first exemplary method of designing the power amplifier of this embodiment. Specifically, FIG. 14 shows a method of designing the power amplifier shown in FIG. 2, performed by supporting software (a designing CAD tool or the like) executed by a computer.

Referring to FIG. 14, at the outset of the design of the power amplifier (S1), a bias condition for MOS transistor 1 is set to a simulator (S2), and input power is set (S3). Next, the load impedance (ZL) is set to the simulator (S4). Next, the simulator is instructed to calculate the lifetime of MOS transistor 1, for example, using the value of the right side of Equation (8) or Equation (9) (S5-1). It is determined whether or not the calculation has been completed for all predefined load impedances (S6), and if not completed, steps S4, S5-1 are repeated, and the lifetime is calculated while changing the setting for the load impedance. When the calculation is completed, the simulator is instructed to display the calculation result (S7), and output matching circuit 5 is designed on the basis of this calculation result (S8). Thus, the design of the power amplifier is terminated (S9).

Second Example

A description will be given of a second exemplary method of designing a power amplifier of this embodiment.

In the first example shown in FIG. 14, the power amplifier is designed with attention paid to the dependence of the lifetime on the load impedance, but another performance index can be combined as well.

For example, in the power amplifier, output power, power gain, and efficiency depend on the load impedance, and there is an FET evaluation method called "load pull" for clarifying these dependences. Further, in general, this FET evaluation method called the "load pull" is represented on a simulator for application to the designing of the power amplifier.

Figure 15:
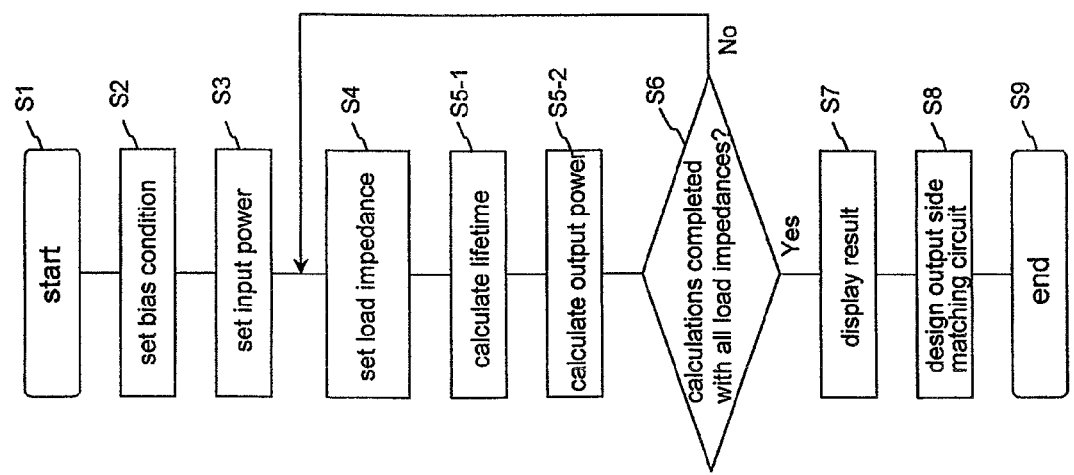
FIG. 15 is a flow chart for describing a second example of a method of designing a power amplifier of this embodiment.

FIG. 15 shows a flow chart showing (part of) the second exemplary method of designing a power amplifier of this embodiment. Specifically, FIG. 15 shows a method of designing the power amplifier shown in FIG. 2, performed by supporting software (a designing CAD tool or the like) executed by a computer.

Referring to FIG. 15, the method of designing a power amplifier of this embodiment is a method which combines the load pull with the lifetime calculation, and particularly in FIG. 15, attention is paid to the output power as the load pull.

The method of designing a power amplifier of this example differs from the first example only in that the output power is calculated (S5-2) in addition to the calculation of the lifetime (S5-1) for MOS transistor 1.

In the following, an exemplary display of the calculation result for MOS transistor 1 at S7 shown in FIGS. 14 and 15 will be described with reference to FIGS. 16 and 17.

Figure 16:
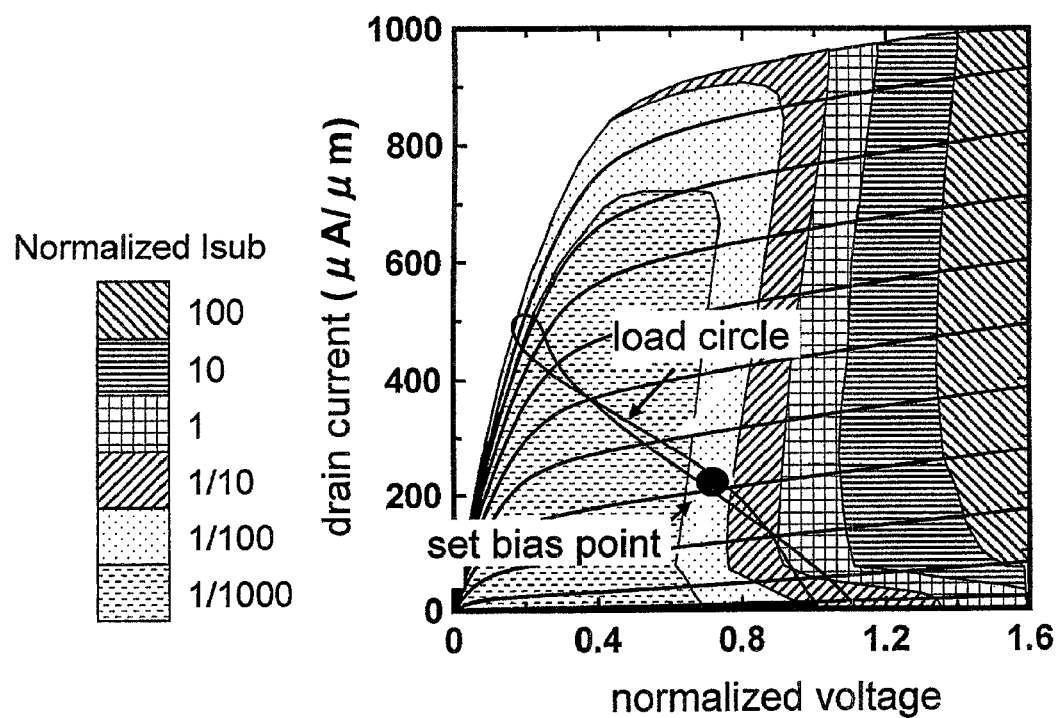
FIG. 16 is a diagram showing a current-voltage characteristic and a load circle, displayed as an exemplary display of a calculation result for the MOS transistor in FIG. 14.

FIG. 16 shows the current-voltage characteristics of MOS transistor 1 as an exemplary display of the calculation result for MOS transistor 1 at S7 shown in FIG. 14. By setting a set bias point and a load impedance, a load circle like FIG. 16 can be drawn using a simulator. While contours for a normalized substrate current (Isub) are also drawn in FIG. 16, the contour lines can be calculated, for example, using Equations (7)-(9).

Simultaneously, the load circle is also plotted (example, when the operation frequency of the power amplifier is 60 GHz). In this event, Age represented by Equation (1) is calculated by accumulating Isub, a drain current and the like captured along the load circle over the time, and the inverse of Age is the lifetime. The plot shown in FIG. 16 is useful as a reference for ensuring the lifetime.

Figure 17:
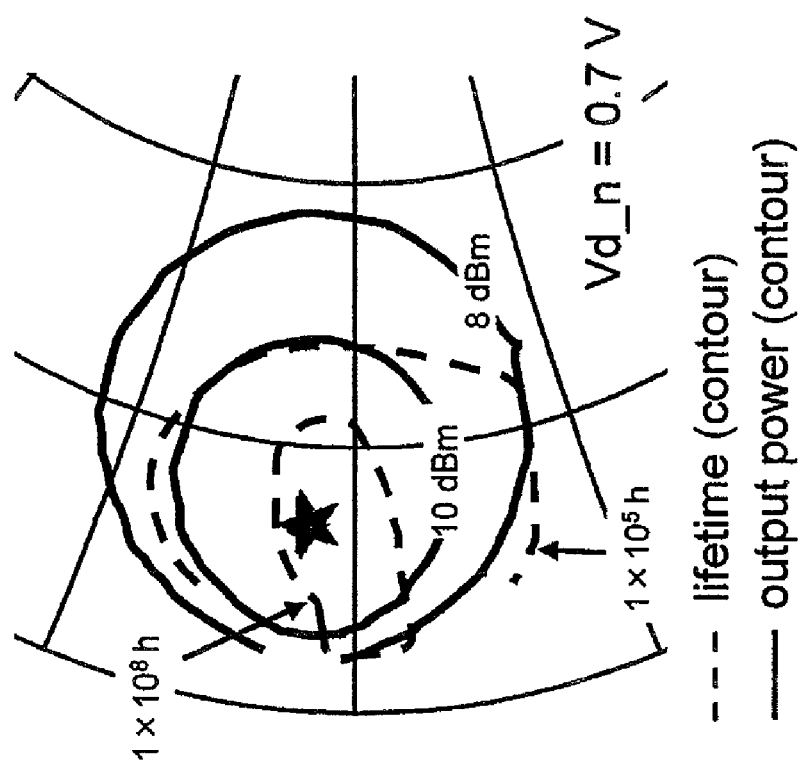
FIG. 17 is a diagram which plots contour lines of an output voltage and a lifetime on a Smith chart, displayed as an exemplary display of a calculation result for the MOS transistor in FIG. 15.

FIG. 17 is a diagram which plots contour lines of the output power and lifetime on a Smith chart which represents the load impedance, displayed as an exemplary display of the calculation result for the MOS transistor at S7 shown in FIG. 14. With the use of FIG. 17, one can understand at first sight whether or not required output power and lifetime can be achieved. Thus, FIG. 17 is very useful for displaying the calculation result (S7). Also, when FIG. 17 is plotted for each power supply voltage (or normalized voltage), the relationship among the output power, lifetime, and power supply voltage can be readily understood, thus providing immeasurable merits during the designing.

Incidentally, the plot of FIG. 16 gives some additional knowledge. For example, when the imaginary part (load reactance XL) of the load impedance takes a positive or negative large value, the load circle inflates, and even enters the right side (toward higher voltages) where the substrate current exponentially increases. It can be estimated that this causes a lifetime deterioration, and is the basis of limiting the imaginary value to the vicinity of zero in the second example of the power amplifier of this embodiment. Also, in the case of a power amplifier which employs a compound semiconductor such as GaAs, a narrow load circle shown in FIG. 16 is not generally drawn at high frequencies. Presumably, this is mainly attributable to a parasitic reactance component.

Since the power amplifier of this embodiment employs a MOS transistor formation process (including a CMOS process) which involves a short gate length and a fine wiring rule, it can be understood that there are a few parasitic reactance components even at high frequency equal to or higher than 10 GHz, a narrow load circle can be realized in a region where XL is small, and deterioration of the lifetime is restrained. FIG. 16 is effective during the designing from the fact that a verification can be made from this viewpoint.

As described above, according to the first and second exemplary methods of designing a power amplifier, it is possible to advantageously clarify the relationship between the output power and lifetime of MOS transistor 1, and design a high-performance power amplifier in a short time because the performance of MOS transistor 1 is readily known. Also, advantageously, a power amplifier can be designed while considering the lifetime, gain, efficiency, distortion characteristic and the like of MOS transistor 1.

While the present invention has been described with reference to the embodiment, the present invention is not limited to the embodiment. The present invention can be modified in configuration and details in various manners which can be understood by those skilled in the art within the scope of the present invention.

This application claims priority based on JP-2007-283539 filed Oct. 31, 2007 and JP-2008-131772 filed May 20, 2008, the disclosure of which is incorporated herein by reference in their entireties.

The invention claimed is:

1. A power amplifier comprising a MOS transistor having a gate length of 180 nm or less, characterized in that:
    said power amplifier is selectively applied with a multi-carrier modulation signal or a single-carrier modulation signal; and
    said MOS transistor is applied with a predetermined DC voltage as a drain-source voltage for single-carrier modulation, and is applied with a DC voltage higher than the predetermined DC voltage as the drain-source voltage for multi-carrier modulation.

2. The power amplifier according to claim 1, characterized in that:
    said MOS transistor is applied with voltage Vd_n normalized by a voltage value allowable in a DC state as the drain-source voltage, and
    said power amplifier comprises a power supply circuit for generating the Vd_n set in a range of 0.5 to 0.9 for the single-carrier modulation, and for generating the Vd_n higher than the range for the single-carrier modulation for the multi-carrier modulation.

3. The power amplifier according to claim 1, characterized in that:
    said MOS transistor is applied with voltage Vd_n normalized by a voltage value allowable in a DC state as the drain-source voltage, and
    said power amplifier comprises a power supply circuit for generating the Vd_n set in a range of 0.5 to 0.9 for the single-carrier modulation, and for generating the Vd_n higher than the range for the single-carrier modulation in a range of 0.9 to 1 for the multi-carrier modulation.

4. The power amplifier according to claim 1, characterized in that
    the single-carrier modulation is one of ASK, FSK, BPSK, QPSK, 8-phase PSK, or 16QAM, and the multi-carrier modulation is OFDM.

5. The power amplifier according to claim 1, characterized in that said MOS transistor is of n-channel.

6. The power amplifier according to claim 1, characterized in that said MOS transistor is formed by a CMOS process.

7. The power amplifier according to claim 1, wherein said power amplifier operates at frequencies equal to or higher than 10 GHz.

8. A method of controlling a power amplifier comprising a MOS transistor having a gate length of 180 nm in a wireless device including said amplifier, said method characterized by comprising the steps of:
    determining whether a signal applied to said power amplifier is a single-carrier modulation signal or a multi-carrier modulation signal;
    applying said MOS transistor with a predetermined DC voltage as a drain-source voltage when the single-carrier modulation signal is applied; and
    applying said MOS transistor with a DC voltage higher than the predetermined DC voltage as the drain-source voltage when the multi-carrier modulation signal is applied.

* * * * *